United States Patent
Rajappan et al.

(10) Patent No.: US 9,576,093 B2
(45) Date of Patent: Feb. 21, 2017

(54) MIXED-WIDTH MEMORY TECHNIQUES FOR PROGRAMMABLE LOGIC DEVICES

(71) Applicant: Lattice Semiconductor Corporation, Hillsboro, OR (US)

(72) Inventors: Venkatesan Rajappan, Fremont, CA (US); Mohana Tandyala, Fremont, CA (US); Hua Xue, Saratoga, CA (US)

(73) Assignee: LATTICE SEMICONDUCTOR CORPORATION, Hillsboro, OR (US)

( * ) Notice: Subject to any disclaimer, the term of this patent is extended or adjusted under 35 U.S.C. 154(b) by 181 days.

(21) Appl. No.: 14/320,169

(22) Filed: Jun. 30, 2014

(65) Prior Publication Data
US 2015/0379164 A1 Dec. 31, 2015

(51) Int. Cl.
*G06F 17/50* (2006.01)
(52) U.S. Cl.
CPC .................. *G06F 17/505* (2013.01)
(58) Field of Classification Search
USPC ........................................................ 716/104
See application file for complete search history.

(56) References Cited

U.S. PATENT DOCUMENTS

| | | | |
|---|---|---|---|
| 6,919,736 B1 | 7/2005 | Agrawal et al. | |
| 6,986,004 B1 | 1/2006 | Cheng et al. | |
| 7,307,912 B1 | 12/2007 | Vernenker et al. | |
| 8,248,869 B1 * | 8/2012 | Chan ................... | G06F 12/0646 365/189.14 |
| 2002/0156985 A1 * | 10/2002 | Abhyankar ......... | G06F 12/0215 711/154 |
| 2007/0162668 A1 * | 7/2007 | Shaeffer .............. | G06F 13/4018 710/68 |

* cited by examiner

*Primary Examiner* — Bryce Aisaka
(74) *Attorney, Agent, or Firm* — Haynes and Boone, LLP

(57) ABSTRACT

Various techniques are provided to efficiently implement user designs in programmable logic devices (PLDs). In one example, a computer-implemented method includes receiving a design identifying operations to be performed by a PLD and synthesizing the design into a plurality of PLD components. The synthesizing includes detecting a mixed-mode memory operation in the design. The mixed-mode memory operation specifies memory access having different read and write data widths using a plurality of embedded memory blocks each having a fixed data width. The synthesizing further includes determining a reduced number of embedded memory blocks to implement the mixed-mode memory operation, and modifying the mixed-mode memory operation to remap the memory access to the reduced number of embedded memory blocks.

20 Claims, 8 Drawing Sheets

MIXED-WIDTH MEMORY TECHNIQUES FOR PROGRAMMABLE LOGIC DEVICES

TECHNICAL FIELD

The present invention relates generally to programmable logic devices and, more particularly, to implementing user designs in such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

Many PLDs today include dedicated memory resources to facilitate efficient implementation of memory components such as random access memories (RAMs), read only memories (ROMs), and first-in first-out (FIFO) memories as may be needed in the user designs. Such dedicated memory resources are typically embedded in PLDs as one or more blocks of static RAM (SRAM), dynamic RAM (DRAM), and/or flash memory that can be configured together with other configurable resources of PLDs to implement memory components having desired functionalities. For example, some embedded memory blocks include circuitry and logic that can be utilized to implement a memory component that can read and write data having mixed widths. That is, those embedded memory blocks support mixed-width mode or mixed-mode memory access and storage where the read data width and the write data width can be different.

However, incorporating the circuitry and logic to support a mixed-width mode may undesirably increase the size and complexity of PLDs having embedded memory blocks, which is especially problematic for low-power, small-footprint PLD, for example, in mobile devices. On the other hand, implementing mixed-width mode memory components of user designs without dedicated circuitry and logic would require user designs to organize multiple embedded memory blocks into particular groupings, which may under-utilize the embedded memory blocks and waste valuable memory resources.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
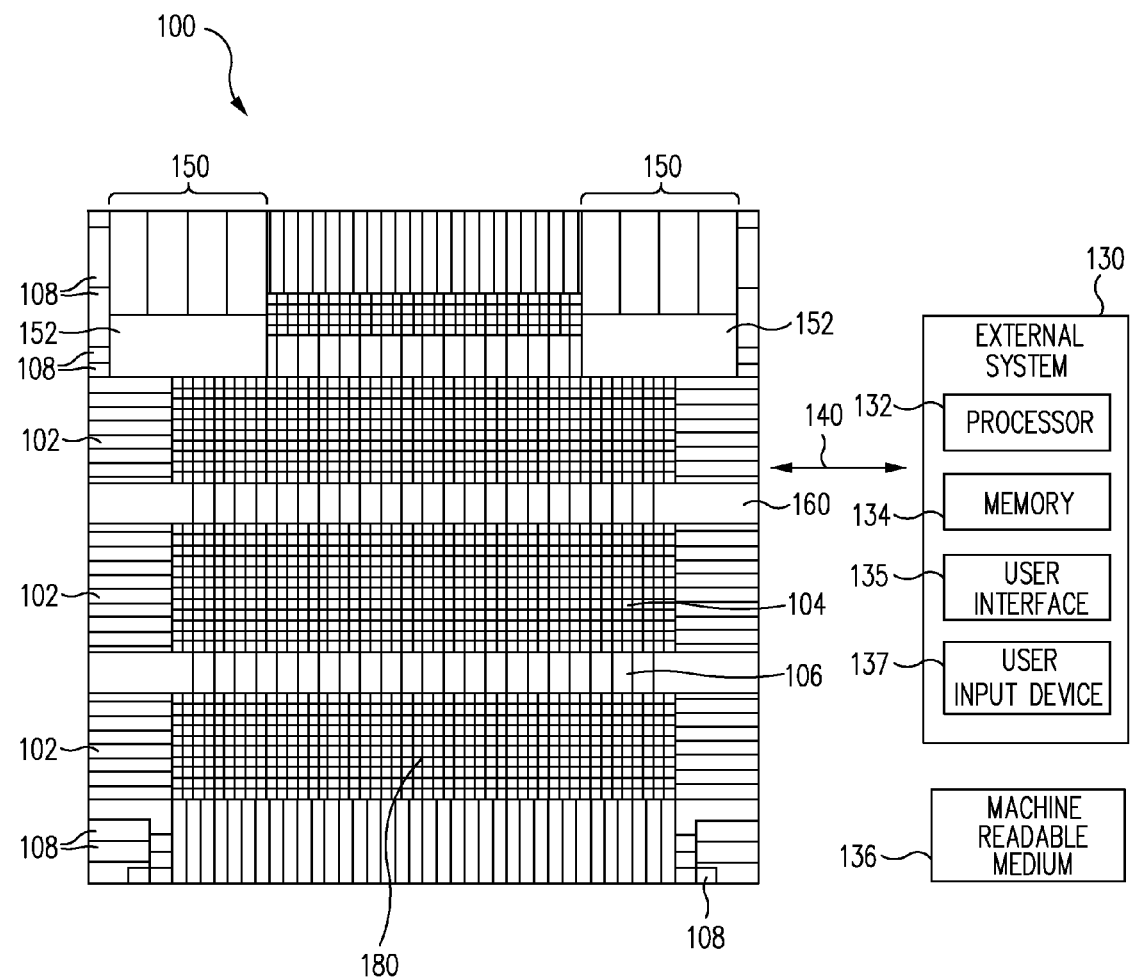
FIG. 1 illustrates a block diagram of a programmable logic device (PLD) in accordance with an embodiment of the disclosure.

In accordance with embodiments set forth herein, techniques are provided to efficiently implement user designs for programmable logic devices (PLDs) having embedded memory blocks. More particularly, user designs specifying mixed-mode (also referred to as mixed-width mode) memory components may, in various embodiments of the present disclosure, be efficiently implemented by fixed-mode embedded memory blocks that do not natively support (e.g., do not include the associated circuitry and/or logic to support) mixed-mode memory access. As discussed herein, a plurality of such fixed-mode embedded memory blocks (e.g., embedded memory blocks lacking a native mixed-mode support) may be organized in a cascaded manner (also referred to as memory block cascading) in order to achieve mixed-mode memory access, which in many cases results in the fixed-mode embedded memory blocks being only partially utilized. For example, in many cases, only a portion of a memory line may be utilized to store meaningful data when fixed-mode embedded memory blocks are cascaded to allow mixed-mode memory access.

In various embodiments, a memory repacking process may be performed on user designs to reduce or eliminate such under-utilization of fixed-mode embedded memory blocks that are cascaded to achieve mixed-mode memory access. In some embodiments, such a process may include detecting, from a user design for a PLD with fixed-mode embedded memory blocks, instances of mixed-mode memory components that would result in partial utilization of the embedded memory blocks. Upon detection of such a mixed-mode memory component in the user design, the process may reassign, remap, adjust, or generate various control and data signals, so that the data to be written to and read from the mixed-mode memory component is shared and/or spread across fewer embedded memory blocks than specified in the user design.

For example, in some embodiments, a process may determine a smaller number (e.g., a reduced number) of embedded memory blocks to implement the mixed-mode memory component, and reassign write address signals and write data signals to the smaller number of embedded memory blocks. Write enable signals in the user design may also be combined and reassigned to the smaller number of embedded memory blocks, and logic to generate write masks for the smaller number of embedded memory blocks may be provided, according to such embodiments. In some embodiments, read address signals and read data signals may be reassigned, and operations to combine read data may be adjusted or modified accordingly.

Thus, after a memory repacking process according to one or more embodiments is performed to modify the user design, a PLD configured to implement the modified user design would consume fewer embedded memory blocks to provide a mixed-mode memory component by reducing or eliminating portions of embedded memory blocks that would otherwise be unused and wasted. As a result, one or more embedded memory blocks of the PLD may advantageously be freed up for implementing additional memory components in the PLD.

A PLD configured with the modified user design may, for example, perform operations that involve writing to and reading from a mixed-mode memory component. According to various embodiments, the PLD performing such operations may generate (e.g., according to the mask generation logic provided in the modified user design) a write mask for a corresponding embedded memory block based on one or more write enable signals associated with the mixed-mode memory component. The PLD may then write data in one portion of a memory line of the embedded memory block without overwriting other portions of the memory line according to the generated write mask, thereby allowing other portions of the memory line to be occupied by other data. According to various embodiments, when performing an operation to read data having a wider width than the write data, the PLD may read data from multiple portions of a memory line, where the multiple portions may be from one embedded memory block or spread across multiple embedded memory blocks. The PLD may then combine the data read from the multiple memory line portions to generate output data for the read operation.

Therefore, the PLD configured with the modified user design to implement the mixed-mode memory, component beneficially utilizes the memory lines of the embedded memory blocks without waste while advantageously providing mixed-mode memory access operations without a need for dedicated circuitry and/or logic to natively support mixed-mode access in the embedded memory blocks. In some embodiments, the various techniques described herein may be applied to PLDs in the iCE40 family of devices available from Lattice Semiconductor Corporation, or other devices as appropriate.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include a plurality of embedded memory blocks 106 (e.g., blocks of SRAM, EEPROM, flash memory, and/or other memory devices), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, embedded memory blocks 106 may include fixed-mode memory blocks which may be used for implementing memory components such as RAMs, ROMs, FIFO memories, or other memory components having desired functionalities. In this regard, each embedded memory block 106 may have a specified number of memory lines (e.g., words) of a specific fixed width (e.g., number of bits), which together define the size of each embedded memory block 106 (e.g., number of lines×width=embedded memory block size). In some embodiments all embedded memory blocks 106 may be of a same size, whereas in other embodiments embedded memory blocks 106 may be provided in two or more different sizes. A suitable number of embedded memory blocks 106 may be provided depending on the desired application of PLD 100. Some specific but non-limiting examples of PLD 100 may include eight to thirty two embedded memory blocks 106 (e.g., when PLD 100 is implemented as a device in the iCE40 family of FPGAs available from Lattice Semiconductor Corporation). Depending on the desired functionalities and/or sizes, a memory component may be implemented using a single embedded memory block 106 or using two or more embedded memory blocks 106 configured together with other configurable resources of PLD 100.

Certain I/O blocks 102 may be used for programming embedded memory blocks 106 or transferring information (e.g., various types of user data and/or control signals) to/from PLD. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). I/O blocks 102 typically, for example, may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources 180 to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, routing resources 180, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
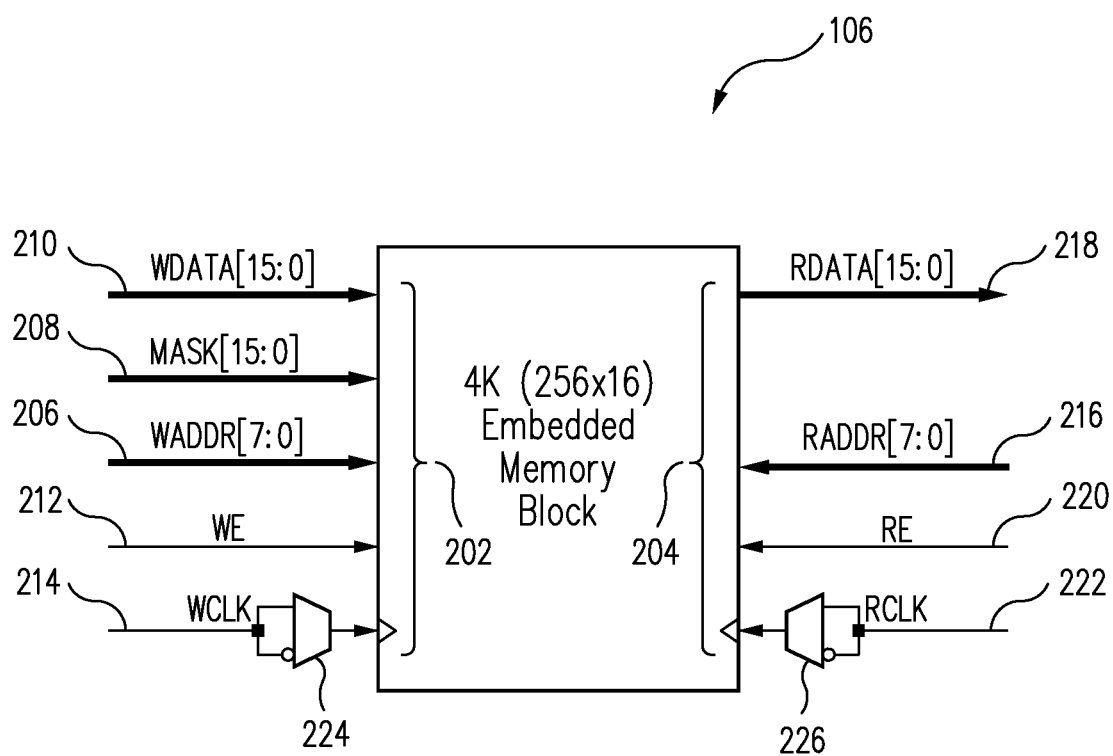
FIG. 2 illustrates a block diagram of an embedded memory block of a PLD in accordance with an embodiment of the disclosure.

FIG. 2 illustrates a block diagram of an embedded memory block 106 of PLD 100 in accordance with an embodiment of the disclosure. In some applications of PLD 100, embedded memory block 106 may also be referred to an embedded block ram (EBR). As discussed, PLD 100 includes a plurality of embedded memory blocks 106 to facilitate implementation of memory components as desired in particular user designs.

In the example embodiment shown in FIG. 2, embedded memory block 106 includes 256 locations (e.g., selectable by corresponding 256 8-bit addresses) of memory lines (also referred to as words) each capable of storing a 16-bit wide data. In other words, the example embedded memory block 106 is a 256×16-bit memory element having a size of 4096 bits or 4K bits. Embedded memory block 106 includes a write port 202 for receiving control and data signals to write data to a memory line. Embedded memory block 106 also includes a read port 204 for receiving control signals and transmitting data signals to read data from a memory line. In this sense, read port 204 and write port 202 are associated with control signals and data signals sent to and/or received from various internal components of PLD 100 and/or external devices (e.g., passed by routing resources 180 and/or I/O blocks 102).

In various embodiments, such control signals and data signals associated with write port 202 include write data signal 210, write mask signal 208, write address signal 206, write enable signal 212, and write clock signal 214. In various embodiments, such control signals and data signals associated with read port 204 include read data signal 218, read address signal 216, read enable signal 220, and read clock signal 222. Write data signal 210 and read data signal 218 for the example embodiment of embedded memory block 106 shown in FIG. 2 are both 16-bit wide (denoted by range [15:0]), corresponding to 16-bit wide memory lines in the example embedded memory block 106. In other examples, write data signal 210 and read data signal 218 may have widths corresponding to the width of memory lines in those examples. Write address signal 206 and read address signal 216 for the example embodiment of embedded memory block 106 shown in FIG. 2 are both 8-bit wide (denoted by range [7:0]), thereby addressing $2^8$=256 locations of memory lines available in the example embedded memory block 106. In other examples, write address signal 206 and read address signal 216 may have widths to address the number of memory lines provided in those examples.

In various embodiments, the widths of write data signal 210 and read data signal 218 are same, and the widths of write address signal 206 and read address signal 216 are same. Moreover, the widths of write data signal 210, read data signal 218, write address signal 206, and read address signal 216 are invariable (e.g., remain fixed). In this regard, embedded memory block 106 according to various embodiments provides fixed-mode (also referred to as fixed-width mode) memory access, but does not natively support mixed-mode (also referred tows mixed-width mode) memory access. As such, embedded memory block 106, according to various embodiments, eliminates the complexity of providing dedicated circuitry and/or logic to support mixed-mode memory access. This is advantageous especially for low-power, small-footprint applications of PLD 100 that are becoming more and more popular, for example, in mobile devices.

In various embodiments, write mask signal 208 can be used to control which portion or portions of a memory line may be written with data provided via write data signal 210. Write mask signal 208 for the example embodiment of embedded memory block 106 shown in FIG. 2 is 16-bit wide (denoted by range [15:0]), corresponding to the width of the memory lines in the example embedded memory block 106. Thus, write mask signal 208 in this example may be used to control writing of the memory lines at a bit-level granularity. For example, in some embodiments, a signal asserted (e.g., by providing a signal representative of binary value 1) on a bit position of write mask signal 208 may prevent the corresponding bit position of the memory lines from being written, whereas a signal deasserted (e.g., by providing a signal representative of binary value 0) on a bit position of write mask signal 208 may allow the corresponding bit position of the memory lines to be written, or vice-versa. Such binary bit values are merely examples, and other values may be used where appropriate.

In some embodiments, write mask signal 208 may be narrower than the width of the memory lines in embedded memory block 106, thereby controlling write operations at a coarser granularity than a bit-level granularity. For example, in some embodiments, write mask signal 208 may be used to control writing operation at a byte-level (e.g., a group of 8 bits) granularity. Write mask signal 208 according to such embodiments may also be referred to as a byte-enable signal and/or a byte-disable signal.

In various embodiments, write enable signal 212 can be used to enable writing of data to embedded memory block 106. For example, in some embodiments, when write enable signal 212 is asserted, data provided via write data signal 210 may be written to a memory line addressed by write address signal 206, with one or more selected portions of the memory line masked out from being written into according to write mask signal 208 if applicable. According to various embodiments, the timing of such a write operation may be controlled by write clock signal 214 (e.g., provided by clock-related circuitry 108) that may trigger various sub-operations of a write operation at its rising edge or falling edge. In some embodiments, a multiplexer 224 of embedded memory block 106 may be configurable to select either a rising edge or a falling edge for such triggering.

In various embodiments, read enable signal 220 can be used to enable reading of data from embedded memory block 106. For example, in some embodiments, when read enable signal 220 is asserted, data stored in a memory line addressed by read address signal 216 may be transmitted via read data signal. According to various embodiments, timing of such a read operation may be controlled by read clock signal 222 that may trigger various sub-operations of a read operation at its rising edge or falling edge. In some embodiments, a multiplexer 226 of embedded memory block 106 may be configurable to select either a rising edge or a falling edge for such triggering.

In the example embodiment of FIG. 2, write port 202 and read port 204 each include its own address, enable, and clock signals as shown, thereby allowing independent control of reading and writing operations. In this regard, the example embedded memory block 106 of FIG. 2 may be referred to as a dual-port memory element. In other embodiments, embedded memory block 106 may be implemented with a single-port memory element that has common address, enable, and/or clock signals for read and write operations. It should be noted that techniques described herein for repacking memory are applicable to both dual-port and single-port memory implementations of embedded memory block 106.

Various embodiments of embedded memory block 106 may thus be utilized as a building block for implementing various types of memory components having desired functionalities and/or sizes. For example, memory components such as a single-port RAM, dual-port RAM, scratchpad RAM, register file, FIFO memory for data buffering, ROM, counter, and sequencer in user designs may be implemented in PLD 100 by configuring appropriate number of embedded memory blocks 106 together with other configurable resources of PLD 100 as needed.

As briefly discussed above, embedded memory blocks 106 may be utilized to implement a mixed-mode memory that allows a write data width (and a corresponding write address width) to be different from a read data width (and a corresponding address data width). A mixed-mode memory may, for example, have a 32K-bit size and allow 32-bit wide data to be written to 1024 address locations (addressable by a 10-bit address) and 128-bit wide data to be read from 256 address locations (addressable by an 8-bit address). In other examples, a mixed-mode memory may allow 9-bit wide data writes to 1024 address locations (also referred to as a write size of 1024×9) and 18-bit wide data reads from 512 address locations (also referred to as a read size of 512×18), or any other write sizes and read sizes as desired for particular user designs. Mixed-mode memories are useful in many user designs such as those that involve serializing-deserializing operations (e.g., SERDES devices), interfacing with buses of different widths, or other operations on different widths of data.

Figure 3:
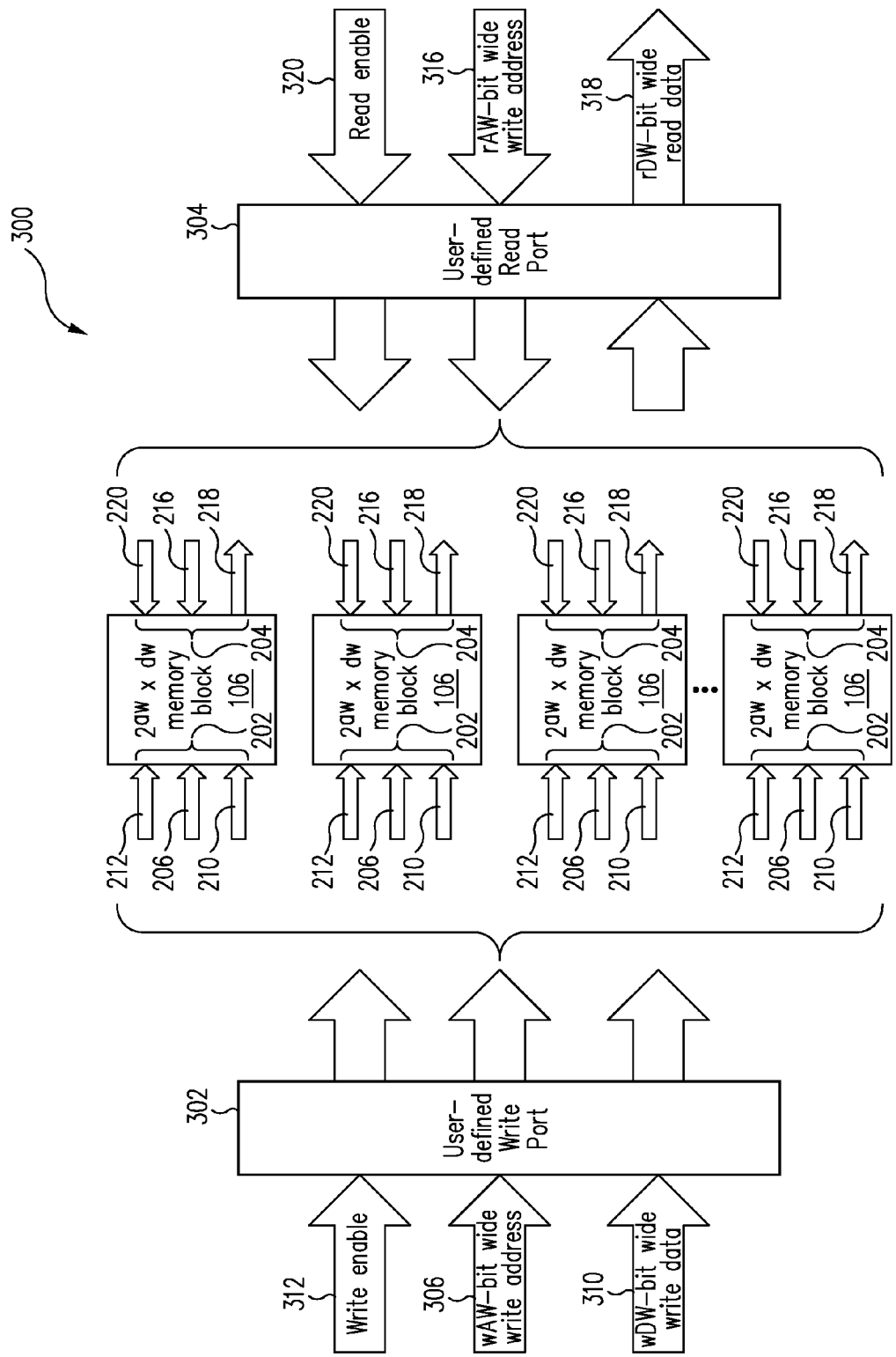
FIG. 3 illustrates a portion of a user design utilizing a plurality of embedded memory blocks in accordance with an embodiment of the disclosure.

FIG. 3 is a block diagram illustrating a portion of a user design employing memory block cascading of fixed-mode embedded memory blocks 106 to implement a mixed-mode memory component 300, in accordance with an embodiment of the disclosure. In the example user design of FIG. 3, a user-defined write port 302 is specified to receive a user-defined write address signal 306 that is wAW bits wide, a user-defined write data signal 310 that is wDW bits wide, and a user-defined write enable signal 312. The example user design of FIG. 3 includes a user-defined read port 304 that is specified to receive a user-defined read address signal 316 that is rAW bits wide and a user-defined read enable signal 320, and to transmit a user-defined read data signal 318 that is rDW bits wide. User-defined read port 304 and write port 302 according to various examples may also receive other signals (e.g., not shown in FIG. 3 to improve clarity).

In various examples, the width wAW of user-defined write address signal 306 and the width wDW of user-defined write data signal 310 are respectively different from the width rAW of user-defined read address signal 316 and the width rDW of user-defined read data signal 318, thereby defining a mixed-mode memory component 300. The size of the user-defined mixed-mode memory component 300 (denoted as user-mem-size) is:

$$\text{user-mem-size} = 2^{wAW} \times wDW = 2^{rAW} \times rDW \quad \text{(Equation 1)}$$

In various examples, user-defined read port 304 and user-defined write port 302 define or otherwise specify logic and connections to generate and/or assign control and data signals to and from a plurality of embedded memory blocks 106, based on various control and data signals including signals 306, 310, 312, 316, 318, and 320 associated with user-defined read port 304 and write port 302. For example, generation and/or assignment of control and data signals including write address signals 206, write data signals 210, write enable signals 212, read address signals 216, read data signals 218, and read enable signals 220 associated with embedded memory blocks 106 may be defined or otherwise specified in user-defined write port 302 and user-defined read port 304. In some examples, other control signals discussed above with respect to FIG. 2 may also be provided by user-defined write port 302 and/or user-defined read port 304.

Thus, the example user designs discussed with reference to FIG. 3 utilize a plurality of embedded memory blocks 106 as building blocks to implement a mixed-mode memory, by providing and distributing various control and data signals to the plurality of embedded memory blocks 106. Depending on the data widths and the number of addresses (as defined by the address widths) associated with the user-defined mixed-mode memory and each embedded memory block 106, an appropriate number of embedded memory blocks 106 may be utilized. For example, if "aw" denotes the address width (e.g., the width of write address signal 206 or read address signal 216, which are same in embedded memory block 106 as discussed above) and "dw" denotes the data width (e.g., the width of write data signal 210 or read data signal 218, which are same in embedded memory block 106 as discussed above) associated with each embedded memory block 106, then the size of each embedded memory block 106 (denoted as embedded-mem-size) can be expressed as $2^{aw} \times dw$, and the minimum number of embedded memory blocks 106 to implement a user-defined mixed-mode memory can be expressed as:

$$\begin{aligned}\text{ceiling}(\text{user-mem-size} / \text{embedded-mem-size}) &= \\ \text{ceiling}(2^{wAW} \times wDW / 2^{aw} \times dw) &= \\ \text{ceiling}(2^{rAW} \times rDW / 2^{aw} \times dw)&\end{aligned} \quad \text{(Equation 2)}$$

In Equation 2, user-mem-size is the size of the user-defined memory, which is $2^{wAW} \times wDW = 2^{rAW} \times rDW$ as discussed in connection with Equation 1.

That is, the memory block cascading examples discussed with reference to FIG. 3 may utilize at least this minimum number and often more of embedded memory blocks 106 to implement a user-defined mixed-mode memory. As further discussed herein, various techniques of the present disclosure may advantageously reduce the number of embedded memory blocks 106 in such memory block cascading down to this minimum number by reducing or eliminating underutilization of embedded memory blocks 106.

Figure 4:
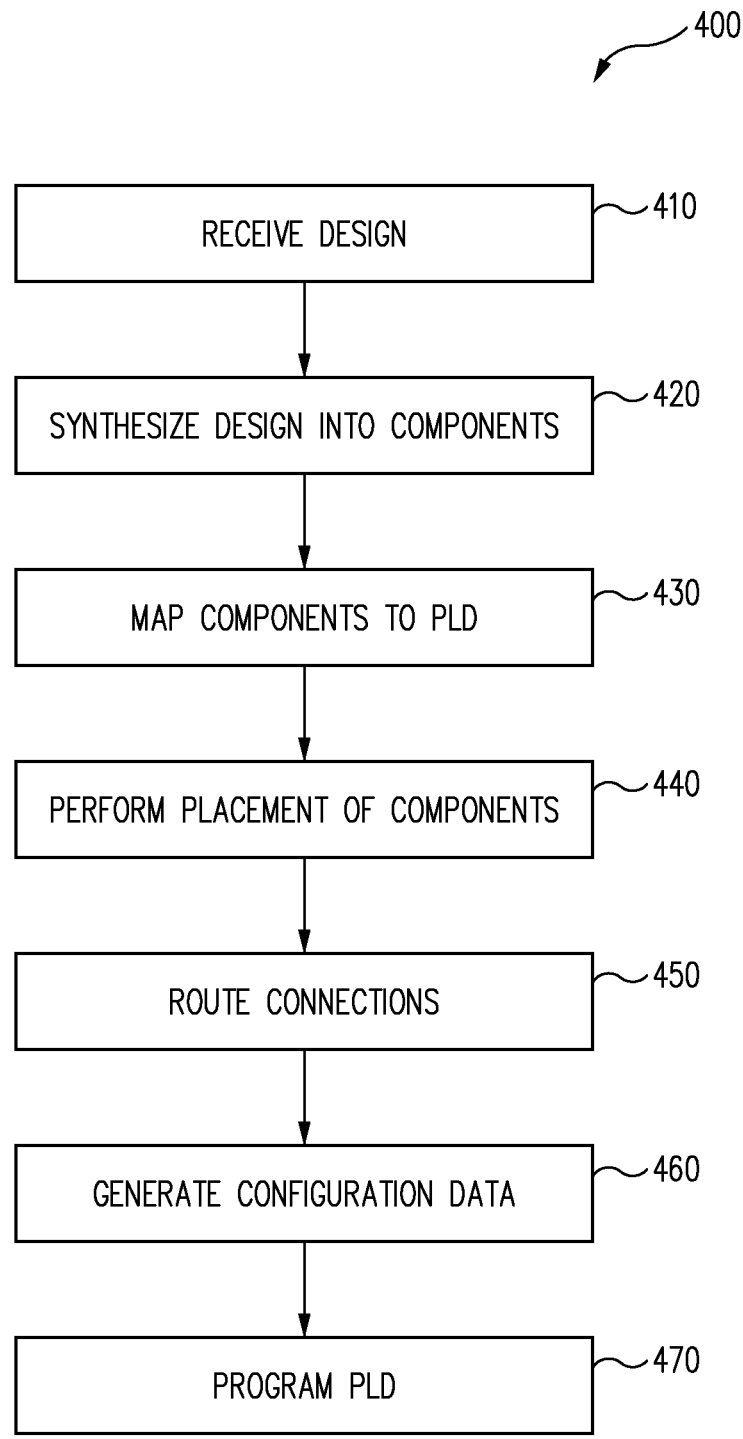
FIG. 4 illustrates a design process for a PLD in accordance with an embodiment of the disclosure.

Turning now to FIG. 4, a design process 400 for a PLD is illustrated in accordance with an embodiment of the disclosure. For example, process 400 may include automatically detecting from user designs instances of mixed-mode memory components that would result in under-utilization of embedded memory blocks and reducing the number of embedded memory blocks 106 to implement the mixed-mode memory components in PLD 100. In some embodiments, process 400 of FIG. 4 may be performed by system 130 running Lattice Diamond software to configure PLD 100. In some embodiments, the various files and information referenced in FIG. 4 may be stored, for example, in one or more databases and/or other data structures in memory 134, machine readable medium 136, and/or otherwise.

In operation 410, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 420, system 130 synthesizes the user design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In various embodiments, synthesizing the user design into a netlist in operation 420 includes detecting, from the user design, instances of user-defined mixed-mode memory that would result in under-utilization of embedded memory blocks 106 when implemented in PLD 100. For example, such instances may be detected (e.g., inferred) from HDL code, RTL description, or other descriptions of a portion of the design specifying user-defined write and read ports (e.g., user-defined write port 302 and user-defined read port 304) with differing data widths and certain characteristics relative to embedded memory blocks 106 provided in PLD 100. In various embodiments, upon detection of such instances of user-defined mixed-mode memory from the user design, process 400 may reassign, remap, adjust, or generate various control and data signals associated with embedded memory blocks 106 to be utilized to implement the user-defined mixed-mode memories, so that data to be written to and read from the mixed-mode memories is shared and/or spread across fewer embedded memory blocks 106 than specified in the user design, as further described herein with reference to FIGS. 5-8.

In operation 430, system 130 performs a mapping process that identifies components of PLD 100 that may be used to implement the user design. In this regard, system 130 may map the synthesized netlist (e.g., stored in operation 420) to various types of components provided by PLD 100 (e.g., logic blocks 104, embedded memory blocks 106, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 420 to produce a netlist that is mapped to PLD components.

In operation 440, system 130 performs a placement process to assign the mapped netlist components to particular physical components residing at specific physical locations of the PLD 100 (e.g., assigned to particular logic blocks 104, embedded memory blocks 106, and/or other physical components of PLD 100), and thus determine a layout for the PLD 100. In some embodiments, the placement may be performed on one or more previously-stored NCD files, with the placement results stored as another physical design file.

In operation 450, system 130 performs a routing process to route connections (e.g., using routing resources 180) among the components of PLD 100 based on the placement layout determined in operation 440 to realize the physical interconnections among the placed components. In some embodiments, the routing may be performed on one or more previously-stored NOD files, with the routing results stored as another physical design file.

Thus, following operation 450, one or more physical design files may be provided which specify the user design after it has been synthesized (e.g., including modifications or adjustments to reduce or eliminate under-utilization of embedded memory blocks 106 associated with user-defined mixed-mode memories in the user design), mapped, placed, and routed for PLD 100 (e.g., by combining the results of the corresponding previous operations). In operation 460, system 130 generates configuration data for the synthesized, mapped, placed, and routed user design. In operation 470, system 130 configures PLD 100 with the configuration data by, for example, loading a configuration data bitstream into PLD 100 over connection 140.

Figure 5:
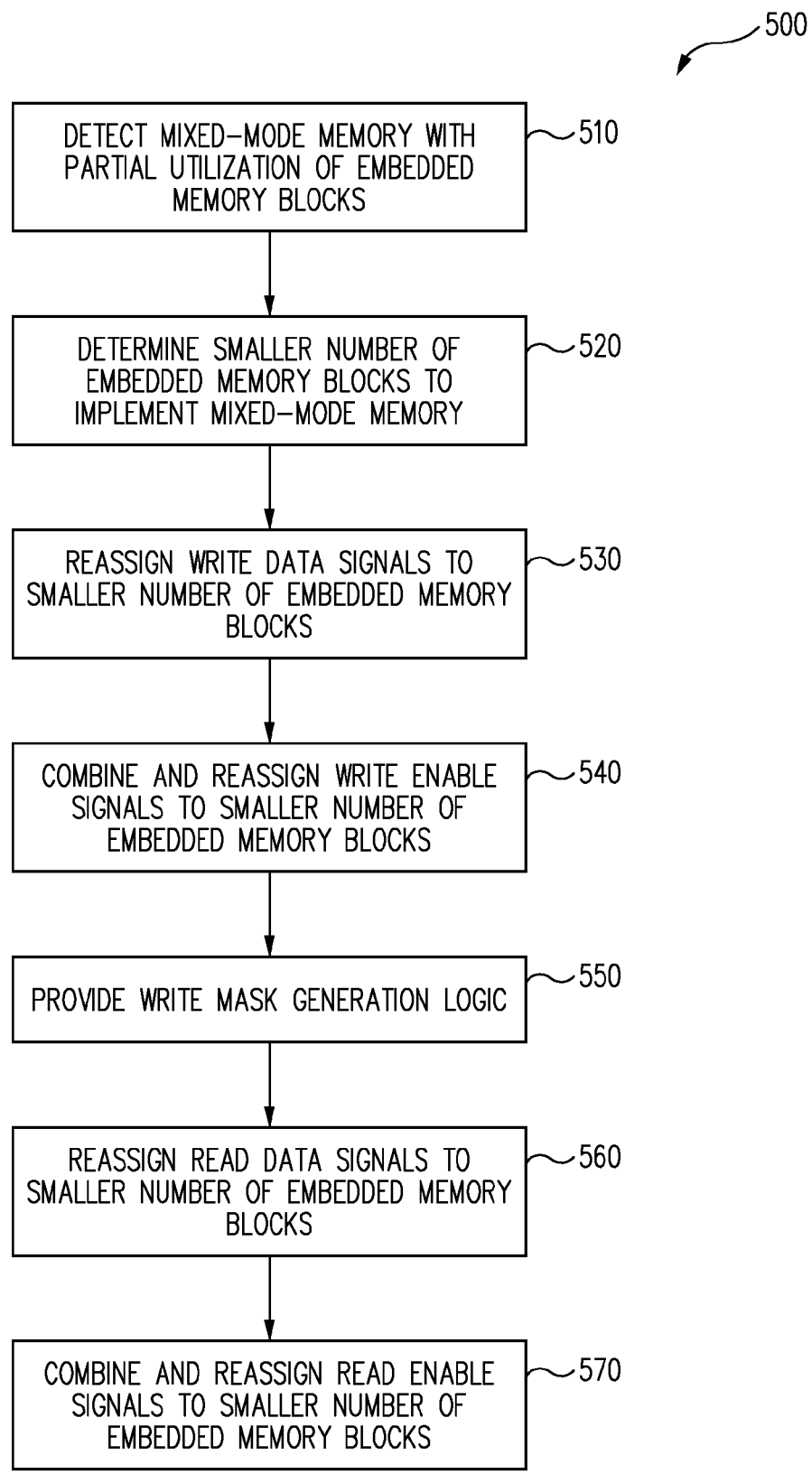
FIG. 5 illustrates a memory repacking process for PLD synthesis in accordance with an embodiment of the disclosure.

FIG. 5 illustrates a process 500 (e.g., also referred to as a memory repacking process) to efficiently implement a user-defined mixed-mode memory for a PLD (e.g., PLD 100) comprising fixed-mode physical memory components (e.g., embedded memory blocks 106), in accordance with an embodiment of the disclosure. In some embodiments, memory repacking process 500 may be performed during operation 420 of process 400 as discussed above. In some embodiments, process 500 may be executed by system 130 to detect and optimize certain instances of user-defined mixed-mode memory that would lead to under-utilization (e.g., utilize only a portion of a memory line) of embedded memory blocks 106 when PLD 100 is configured with a user design.

Figure 6:
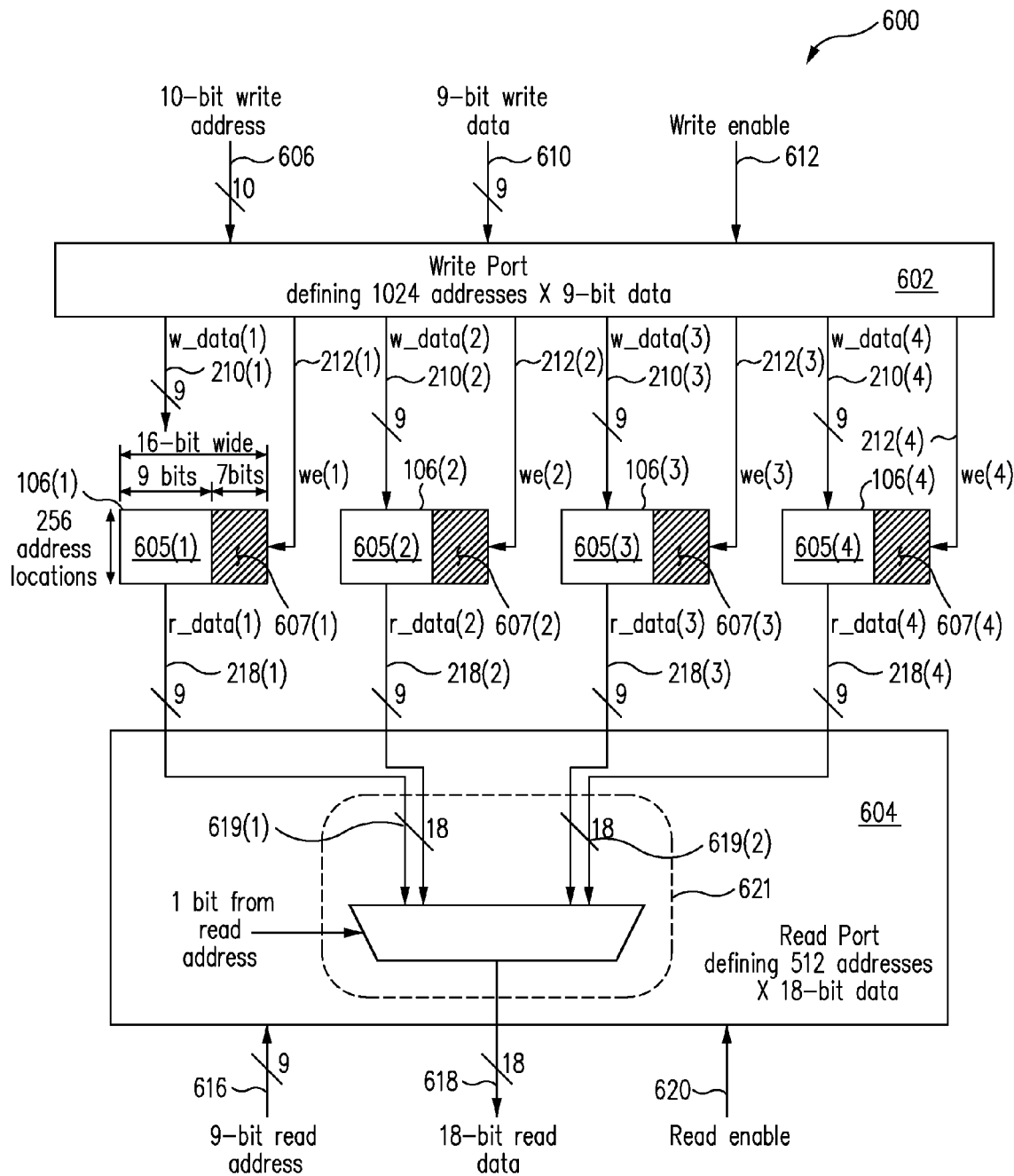
FIG. 6 illustrates a portion of another user design utilizing a plurality of embedded memory blocks in accordance with an embodiment of the disclosure.

Referring also to FIG. 6, a portion of a user design is illustrated that utilizes memory block cascading of fixed-mode embedded memory blocks 106 to implement a user-defined mixed-mode memory component, in accordance with an embodiment of the disclosure. Specifically, FIG. 6 illustrates an example user design that cascades a plurality of embedded memory blocks 106(1)-106(4) together under a user-defined write port 602 and a user-defined read port 604, as discussed above with respect to FIG. 3. Cascaded embedded memory blocks 106 are also referred to herein as direct-mapped memory blocks.

In the example user design 600 of FIG. 6, user-defined write port 602 is defined or otherwise specified to receive a 10-bit user-defined write address signal 606, a 9-bit user-defined write data signal 610, a user-defined write enable signal 612, and/or other applicable signals to write 9-bit data to one of 1024 address locations, whereas user-defined read port 604 is defined or otherwise specified to receive a 9-bit user-defined read address signal 616, a user-defined read enable signal 620, and/or other applicable signals to provide 18-bit data from one of 512 address locations via an 18-bit user-defined read data signal 618. Thus, user-defined write port 602 and user-defined read port 604 specify a mixed-mode memory with a 1024×9-bit write size and a 512×10-bit read size.

In the example user design 600 of FIG. 6, user-defined write port 602 and user-defined read port 604 cascade four 256×16-bit embedded memory blocks 106(1)-106(4) to implement the mixed-mode memory of the desired write and read sizes, by generating and/or distributing various control and data signals to the four embedded memory blocks 106(1)-106(4). More specifically, for example, user-defined write port 602 may be defined or otherwise specified to distribute the 9-bit data received via user-defined write data signal 610 to write data signals 210(1)-210(4) associated with the four embedded memory blocks 106(1)-106(4). Note that because write data signals 210(1)-210(4) are each 16-bit wide, the remaining 7 bits for each write data signals 210(1)-210(4) may be undefined or otherwise unused (e.g., "don't-care" bits).

In addition, user-defined write port 602 may be defined or otherwise specified to generate and assign write enable signals 212(1)-212(4) and write address signals 206(1)-206(4) for embedded memory blocks 106(1)-106(4) (e.g., shown in FIG. 2 for one embedded memory block 106) based on user-defined write address signal 606 and write enable signal 608, such that the 9-bit data received via user-defined write data signal 610 is written to an address location (e.g., a memory line) of an appropriate one of the four embedded memory blocks 106(1)-106(4). In one example, user-defined write port 602 may include logic to demultiplex user-defined write enable signal 612 to one of the four write enable signals 212(1)-212(4) based on two bits (e.g., two least significant bits) of user-defined write address 606, while assigning the remaining eight bits of the write address to write address signals 206(1)-206(4). Other examples of user-defined write port 602 may include other appropriate logic to write the received data to an appropriate one of the four embedded memory blocks 106(1)-106(4). Thus, the received 9-bit data may be distributed to four embedded memory blocks 106(1)-106(4) each having 256 address locations, thereby providing 1024 address locations for storing 9-bit data.

On the other hand, user-defined read port 604 may be defined or otherwise specified to generate and assign read address signals 216(1)-216(4) and read enable signals 220(1)-220(4) for the four embedded memory blocks 106(1)-106(4) (e.g., shown in FIG. 2 for one embedded memory block 106) based on user-defined read address signal 616 and user-defined read enable signal 620, such that two of the four embedded memory blocks 106(1)-106(4) are each read-enabled to provide 9-bit data from an appropriate address location out of 256 locations via a corresponding read data signal 618(1), 618(2), 618(3), or 618(4). In addition, user-defined read port 604 may be defined or otherwise specified to combine the two read data signals from the two read-enabled embedded memory blocks to provide 18-bit data via user-defined read data signal 618. For example, user-defined read port 604 may include read data combining logic 621 (or a read data combining operation 621) to bundle 9-bit data signals on read data signals 218(1)-218(4) into two groups 619(1) and 619(2) each containing two 9-bit data portions to provide 18-bit data, and to multiplex the two groups 619(1) and 619(2) using one bit from user-defined read address signal 616 to provide the 18-bit data from either group 619(1) or 619(2) on user-defined read data signal 618. Thus, 18-bit data may be read from two groups of two embedded memory blocks 106 each having 256 address locations, thereby providing 512 address locations for reading 18-bit data.

Consequently, memory block cascading in the example of FIG. 6 provides mixed-mode memory access where 9-bit data can be written to 1024 address locations and 18-bit data can be read from 512 address locations. However, because 9-bit data is written to embedded memory blocks 106(1)-106(4) having 16-bit wide memory lines, only a 256×9-bit portion of each embedded memory block 106(1), 106(2), 106(3), or 106(4) will be an occupied portion 605(1), 605(2), 605(3), or 605(4), while the remainder will be an unutilized or wasted portion 607(1), 607(2), 607(3), or 607(4) (e.g., containing undefined or "don't-care" bits).

Process 500 according to various embodiments may detect instances of memory block cascading for mixed-mode memory access in the user design that lead to such partial utilization of embedded memory blocks 106, and reassign, remap, adjust, or generate various control and data signals associated with such memory block cascading, so that data is shared and/or spread across fewer embedded memory blocks 106 than specified in the user design.

Turning to operation 510 of process 500, system 130 may detect (e.g., infer), from HDL code, RTL description, or other descriptions of the user design, instances of memory block cascading to implement a mixed-mode memory that would result in partial utilization of embedded memory blocks 106 when PLD 100 is configured with the user design. For example, in various embodiments, operation 510 may involve identifying, from the user design, instances of memory block cascading specified by user-defined write port 302/602 and user-defined read port 304/604 having write and read data widths that meet certain conditions with respect to each other and with respect to the data width associated with embedded memory blocks 106.

In this regard, according to some embodiments, system 130 may compare the width wDW of user-defined write data signal 310/610 with the width rDW of user-defined read data signal 318/618 to determine whether user-defined write port 302/602 and user-defined read port 304/604 define or otherwise specify mixed-mode memory access (e.g., having different data widths wDW and rDW). In some embodiments, in addition to or in place of such comparison of the data widths wDW and rDW, the width wAW of user-defined write address signal 306/606 may be compared with the width rAW of user-defined read address signal 316/616 to determine or confirm that user-defined write port 302/602 and user-defined read port 304/604 define or otherwise specify a mixed-mode memory.

Further, according to some embodiments, system 130 may determine (e.g., check) whether the mixed-mode memory defined or otherwise specified via user-defined write port 302/602 and user-defined read port 304/604 would lead to unutilized or wasted portions (e.g., unutilized portions 607) in embedded memory blocks 106, based on the width wDW of user-defined write data signal 310/610, the width rDW of user-defined read data signal 318/618, and the width dw of a memory line (e.g., the width of write data signal 210 or read data signal 218) of each embedded memory block 106. For example, in one embodiment, system 130 may check (e.g., test) the following conditions involving the data widths wDW, rDW, and dw are satisfied:

If rDW<=dw, then dw is an integer multiple of rDW (Condition 1)

If rDW>dw, then rDW is an integer multiple of dw (Condition 2)

If wDW<=dw, then dw is an integer multiple of wDW (Condition 3)

If wDW>dw, then wDW is an integer multiple of dw (Condition 4)

In this embodiment, if any or all of Conditions 1 through 4 are not satisfied, it may be determined that the mixed-mode memory defined or otherwise specified via user-defined write port 302/602 and user-defined read port 304/604 would lead to unutilized or wasted portions in embedded memory blocks 106. In other embodiments, other suitable tests involving the data widths wDW, rDW, and dw may be utilized. Thus, following operation 510, a user-defined mixed-mode memory that may leave unutilized portions in embedded memory blocks 106 may be detected from the user design.

In operation 520, system 130 may determine a number of embedded memory blocks 106 to be utilized for implementing the user-defined mixed-mode memory with the unutilized portions reduced or eliminated. In various embodiments, this number (also referred to herein as the number of remapped memory blocks) may be determined based at least in part on the relative sizes of the user-defined mixed-mode memory and each embedded memory block 106. In various embodiments, this number of remapped memory blocks will be smaller (e.g., reduced) than the number of embedded memory blocks 106 specified in the user-defined mixed-mode memory (also referred to as the number of direct-mapped memory blocks).

For example, in embodiments where write mask signal 208 or other similar technique for each embedded memory block 106 controls write operations at a bit-level granularity, this number of remapped memory blocks may be determined to be the minimum number of embedded memory blocks 106 to implement a user-defined mixed-mode memory discussed above with respect to Equation 2. That is, the number of remapped memory blocks in some embodiments may be determined as ceiling(user-mem-size/embedded-mem-size)=ceiling($2^{wAN}$×wDW/$2^{aw}$×dw)=ceiling($2^{rAW}$×rDW/$2^{aw}$×dw). For the example user-defined mixed-mode memory of FIG. 6, the number of remapped memory blocks is then ceiling($2^{10}$×9/$2^8$×16)=ceiling($2^9$×18/$2^8$×16)=ceiling(36/16)=3, which is smaller than the number of direct-mapped memory blocks specified in the example user design of FIG. 6.

In other embodiments where write mask signal 208 or other similar technique controls write operations to memory lines at a coarser level of granularity than a bit level (e.g., using signals or techniques for controlling write operations at a byte level, nibble level, or other granularities), the number of remapped memory blocks may be equal to or larger than the minimum number. In such embodiments, the number of remapped memory blocks may be determined based on the granularity of write mask operations relative to the data width (e.g., the width of a memory line) of embedded memory blocks 106, in addition to the relative sizes of the user-defined mixed-mode memory and embedded memory blocks 106.

In operation 530, system 130 may reassign (e.g., adjust and/or remap) write data signals 210 associated with the direct-mapped memory blocks (e.g., embedded memory blocks 106(1)-106(4) in FIG. 6) in the user-defined mixed-mode memory, to the determined smaller number of embedded memory blocks (also referred to herein as remapped memory blocks). For example, the remapped memory blocks may be a subset of the direct-mapped memory blocks. In some embodiments, operation 530 may involve determining alignment and assignment of occupied portions (e.g., occupied portions 605(1)-605(4)) of the direct-mapped embedded memory blocks relative to the determined smaller number of embedded memory blocks. In particular for some embodiments, system 130 may determine, for each occupied portion of the direct-mapped memory blocks, new bit positions in one or more of the remapped memory blocks such that the each occupied portion may be placed within and/or across the smaller number of embedded memory blocks 106 without leaving unutilized portions (e.g., unutilized portions 607(1)-607(4)).

Figure 7:
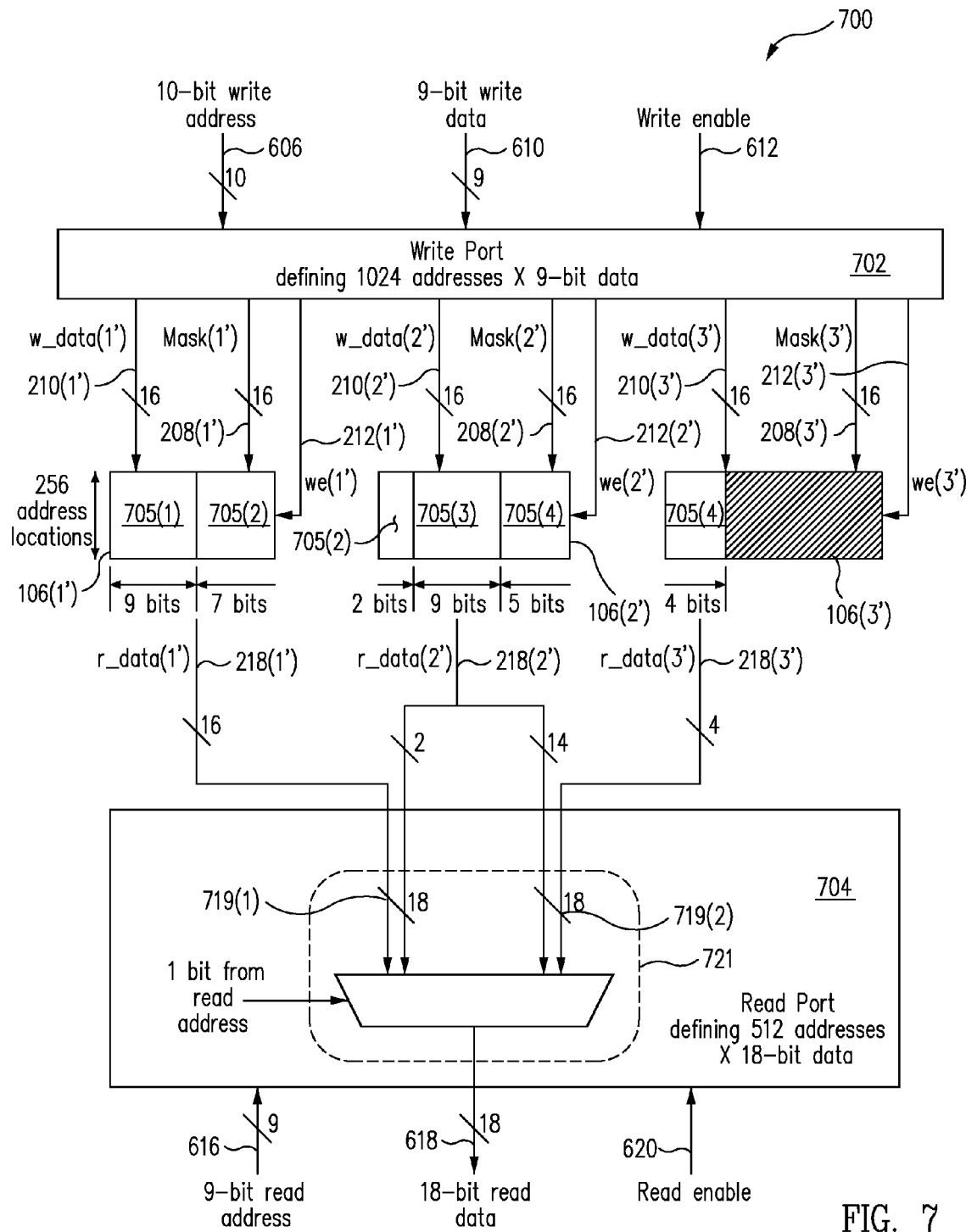
FIG. 7 illustrates the portion of the user design of FIG. 6 following a memory repacking process in accordance with an embodiment of the disclosure.

For example, also referring to FIG. 7 which illustrates a modified user-defined mixed-mode memory component 700 after performing process 500 on the user-defined mixed-mode memory component 600 of FIG. 6 according to an embodiment of the disclosure, occupied portions 605(1)-605(4) of the four direct-mapped memory blocks 106(1)-106(4) in FIG. 6 may be positioned in corresponding remapped portions 705(1)-705(4) within and/or across three remapped memory blocks 106(1')-106(3') in FIG. 7. According to some embodiments, such positions may be determined based on the data width wDW (e.g., the width of user-defined write data signal 310/610) associated with user-defined write port 302/602 and the data width dw (e.g., the width of write data signal 210) associated with each embedded memory block 106, for example, by obtaining quotients and remainders through division and modulo operations using the data widths wDW and dw. In embodiments where write mask signal 208 or other similar technique controls write operations to memory lines at a coarser level of granularity than a bit level, the granularity of write mask signal 208 or other similar technique may also be used to determine the new positions for occupied portions 605(1)-605(4) with respect to the remapped memory blocks 106(1')-106(3').

In various embodiments, write data signals 210(1)-210(4) associated with the direct-mapped memory blocks 106(1)-106(4) may be adjusted, modified, and/or reassigned according to the determined new positions for occupied portions 605(1)-605(4) with respect to the remapped memory blocks 106(1')-106(3') (e.g., according to positions for remapped portions 705(1)-705(4)). In the examples of FIGS. 6 and 7, assuming a write mask granularity of 1 bit, each 9-bit data portion of write data signals 210(1)-210(4) may respectively be reassigned to the first 9 bits of write data signal 210(1') associated with remapped memory block 106(1'), the last 7 bits of write data signal 210(1') and the first 2 bits of write data signal 210(2'), the third through eleventh bits of write data signal 210(2'), and the last 5 bits of write data signal 210(2') and the first 4 bits of write data signal 210(3').

In operation 540, write enable signals (e.g., write enable signals 212(1)-212(4)) associated with the direct-mapped memory blocks 106(1)-106(4) may be combined, adjusted, modified, and/or reassigned according to the determined new positions for occupied portions 605(1)-605(4) with respect to the remapped memory blocks 106(1')-106(3'). For example, in various embodiments, appropriate one or ones of write enable signals 212(1)-212(4) associated with direct-mapped memory blocks 106(1)-106(4) may be combined and/or reassigned as one of write enable signals 212(1')-212(3') associated with remapped memory blocks 106(1')-106

(3'), based on which one or ones of occupied portions 605(1)-605(4) are determined to be placed in each remapped memory block 106(1'), 106(2'), or 106(3').

Figure 8:
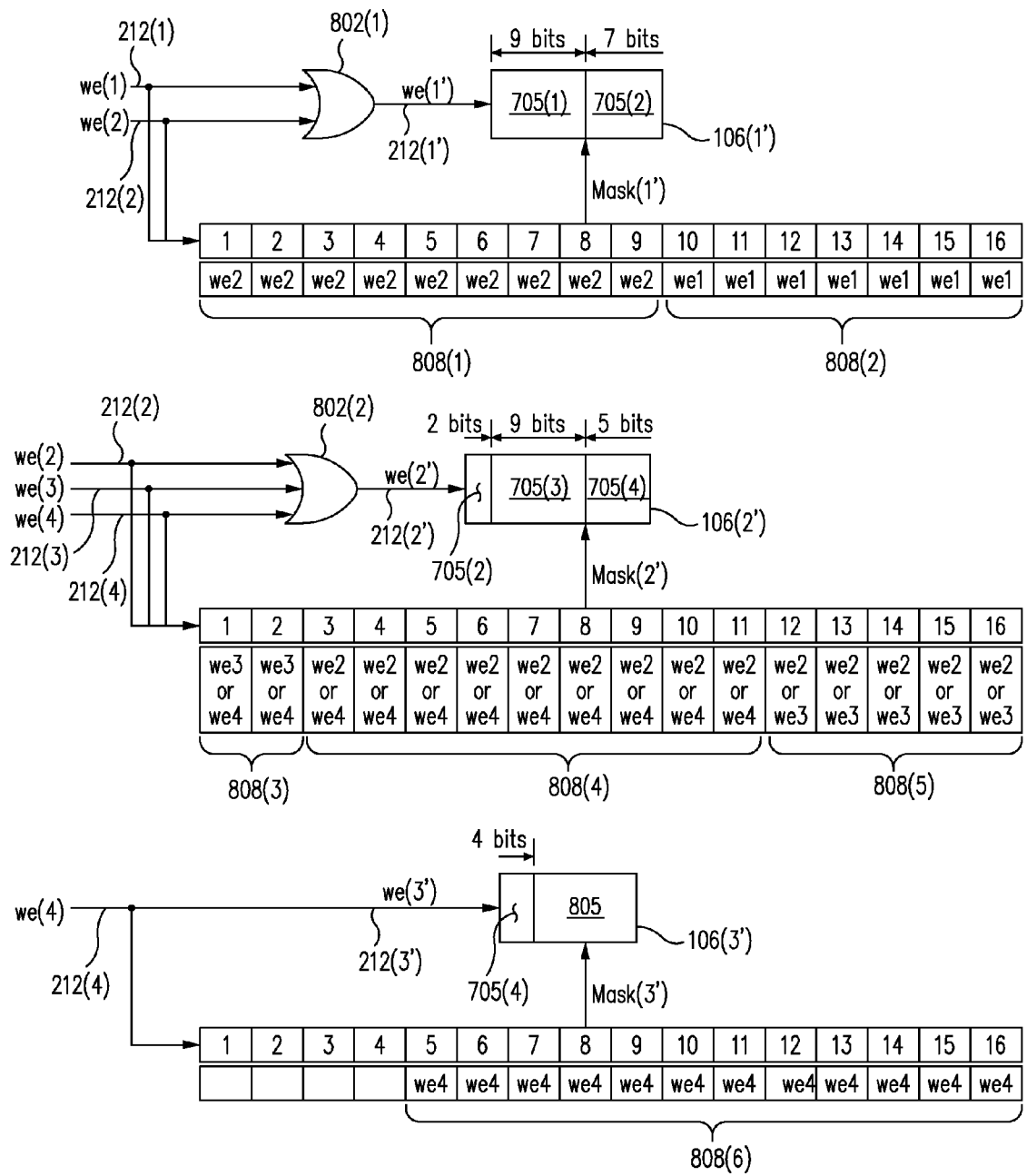
FIG. 8 illustrates a portion of write enable signals and write masks for the user design of FIG. 7 in accordance with an embodiment of the disclosure.

As a further example according to one or more embodiments, FIG. 8 illustrates write enable signals 212(1)-212(4) associated with direct-mapped memory blocks 106(1)-106(4) of FIG. 6 combined and/or reassigned as write enable signals 212(1')-212(3') associated with remapped memory blocks 106(1')-106(3') of FIG. 7 following process 500, in accordance with an embodiment of the disclosure. In the example of FIG. 8, write enable signals 212(1) and 212(2) are combined via an OR operation 802(1) and reassigned as write enable signal 212(1') associated with remapped memory block 106(1'), thereby allowing remapped memory block 106(1') to be enabled for writing data (in remapped portion 705(1) or part of remapped portion 705(2)) in response to a write operation to either occupied portion 605(1) or 605(2) originally associated with direct-mapped memory block 106(1) or 106(2), when PLD 100 is configured with the user design after process 500.

In a similar vein, write enable signals 212(2), 212(3), and 212(4) may be combined via an OR operation 802(2) and reassigned as write enable signal 212(2') associated with remapped memory block 106(2'), so that remapped memory block 106(2') may be enabled for writing when data is to be written to any one of occupied portions 605(2)-605(4) originally associated with direct-mapped memory blocks 106(2)-106(4) in the user-defined mixed-mode memory. For remapped memory block 106(3'), write enable signal 212(4) may be reassigned as write enable signal 212(3'), since only occupied portion 605(4) originally associated with direct-mapped memory block 106(4) is to be positioned in remapped memory block 212(3') as part of remapped portion 705(4).

Thus, in various embodiments, operation 540 may combine and reassign write enable signals 212(1)-212(4) associated with direct-mapped memory blocks 106(1)-106(4) as write enable signals 212(1')-212(3') associated with the determined smaller number of embedded memory blocks 106 (remapped memory blocks 106(1')-106(3')) based on the new positions of occupied portions 605(1)-605(4) with respect to remapped memory blocks 106(1')-106(3'), thereby allowing a corresponding one of remapped memory blocks 106(1')-106(3') to be write-enabled for storing data in one of remapped portions 705(1)-705(4) in response to a write operation to one of occupied portions 605(1)-605(4) in the user-defined mixed-mode memory.

In operation 550, system 130 may provide logic to generate write mask signals 208(1')-208(3') for remapped memory blocks 106(1')-106(3'). For example, system 130 may generate a description or specification of operations (e.g., logical operations, signal assignments, and/or other operations) for generating write mask signals 208(1')-208(3'), and include such a description or specification in the user design so that write mask signals 208(1')-208(3') may be generated as desired when PLD 100 is configured with the user design.

In various embodiments, the logic may be specified to generate write mask signal 208(1'), 208(2'), or 208(3') for a corresponding one of remapped memory blocks 106(1')-106(3'), such that only a desired remapped portion 705(1), 705(2), 705(3), or 705(4) may be written with data while preventing other remapped portion or portions (e.g., one or more of remapped portions 705(1)-705(4) excluding the remapped portion to be written) in the same remapped memory block 106(1'), 106(2'), or 106(3') from being overwritten (e.g., overwritten with undefined data or otherwise made unusable). In this regard, the write mask generation logic according to various embodiments may be configured to generate each write mask signal 208(1'), 208(2'), or 208(3'), based on which one of remapped portions 705(1)-705(4) is to be enabled for writing data and the position of such enabled remapped portion 705(1), 705(2), 705(3), or 705(4) with respect to each remapped memory block 106 (1'), 106(2'), or 106(3'). For example, in some embodiments, write mask signal 208(1'), 208(2'), or 208(3') for a corresponding remapped memory block 106(1'), 106(2'), or 106 (3') may be generated using those one or more of write enable signals 212(1)-212(4) that are combined and/or reassigned to the corresponding remapped memory block 106 (1'), 106(2'), or 106(3'), since those one or more write enable signals relate to which one of remapped portions 705(1)-705(4) is to be enabled for writing.

In the example of FIG. 8, write mask signal 208(1') is generated using write enable signals 212(1) and 212(2) that are combined and reassigned to remapped memory block 106(1'). More specifically, write mask signal 208(1') has signals asserted (e.g., provided with signals representative of binary value 1 or other specified value as appropriate) in bit positions 808(2) corresponding to remapped portion 705(2) when write enable signal 212(1) is asserted to enable data writing of remapped portion 705(1), thereby preventing remapped portion 705(2) from being overwritten when remapped portion 705(1) is enabled for writing. Conversely, write mask signal 208(1') has signals asserted in bit positions 808(1) corresponding to remapped portion 705(1) when write enable signal 212(2) is asserted to enable writing of remapped portion 705(1), thereby preventing remapped portion 705(1) from being overwritten when remapped portion 705(2) is enabled for writing.

Similarly for write mask signal 208(2'), bit positions 808(3) are asserted to prevent remapped portion 705(2) from being overwritten when write enable signal 212(3) or 212(4) is asserted to enable writing to remapped portion 705(3) or 705(4), bit positions 808(4) are asserted to prevent remapped portion 705(3) from being overwritten when write enable signal 212(2) or 212(4) is asserted to enable writing to remapped portion 705(2) or 705(4), and bit positions 808(5) are asserted to prevent remapped portion 705(3) from being overwritten when write enable signal 212(2) or 212(3) is asserted to enable writing to remapped portion 705(2) or 705(3). Optionally, write mask signal 208(3') may be generated for asserting bit positions 808(6) to prevent an unused portion 805 of remapped memory block 106(3') from being overwritten when write enable signal 212(4) is asserted to enable writing to remapped portion 705(3), so that, for example, unused portion 805 may be used for other purposes.

Thus, following operation 550, a write operation for a user-defined mixed-mode memory may advantageously write data in remapped portions 705(1)-705(4) shared and spread across the smaller number of remapped memory blocks 106(1')-106(3') without leaving unutilized portions 607(1)-607(4) and without undesirably overwriting data, when PLD 100 is configured with the user design. Note that in the embodiments illustrated by the example of FIG. 8, bit positions asserted in write mask signals 208(1')-208(3') prevent writing of corresponding positions in memory lines. For other embodiments in which write mask signals 208 (1')-208(3') operate differently (e.g., write mask signals have a coarser granularity and/or bit positions asserted enable writing of corresponding positions in memory lines), operation 550 may be modified according to the principles disclosed herein.

In operation 560, system 130 may reassign (e.g., adjust and/or remap) read data signals 218(1)-218(4) associated with the direct-mapped memory blocks 106(1)-106(4) in the user-defined mixed-mode memory to the remapped memory blocks 106(1')-106(3'), based on the determined new positions for occupied portions 605(1)-605(4) with respect to remapped memory blocks 106(1')-106(3') (the positions for remapped portions 705(1)-705(4)). In the examples of FIGS. 6 and 7, the two 9-bit data portions of read data signals 218(1) and 218(2) providing 18-bit data as group 619(1) may be reassigned as the entire 16 bits of read data signal 218(1') and the first 2 bits of read data signal 218(2'), thereby providing 18-bit data as group 719(1), whereas the two 9-bit data portions of read data signals 218(3) and 218(4) providing 18-bit data as group 619(2) may be reassigned as the last 14 bits of read data signal 218(2') and the first 4 bits of read data signal 218(3'), thereby providing 18-bit data as group 719(2). In this regard, read data combining logic 621 may also be adjusted during operation 560 to provide read data combining logic 721.

In operation 570, the read enable signals associated with the direct-mapped memory blocks 106(1)-106(4) may be combined, adjusted, modified, and/or reassigned according to the determined new positions for occupied portions 605(1)-605(4) with respect to the remapped memory blocks 106(1')-106(3'). For example, in various embodiments, system 130 may combined (e.g., by an OR operation) and/or reassign the read enable signals associated with the remapped memory blocks 106(1')-106(3') according to the principle discussed above for operation 540 to combine and/or reassign write enable signals, thereby allowing appropriate one or ones of remapped memory blocks 106(1')-106(3') to be enabled for reading one of two 18-bit data groups 719(1) and 719(2) in response to an operation to read one of two 18-bit data groups 619(1) and 619(2) from occupied portions 605(1)-605(4) in the user-defined mixed-mode memory, when PLD 100 is configured with the user design after process 500.

Thus, following process 500 according to one or more embodiments, instances of user-defined mixed-mode memory that would result in under-utilization of embedded memory blocks may be detected (e.g., from user-defined write port 602 and read port 604) and modified (e.g., defined or otherwise specified as modified user-defined write port 702 and read port 704) by reassigning, remapping, adjusting, or generating various control and data signals associated with the user-defined mixed-mode memory, so that data to be written to and read from the user-defined mixed-mode memory is shared and/or spread across fewer embedded memory blocks with less waste, when PLD 100 is configured with the user design after process 500. Table 1 lists example cases of various differently sized user-defined mixed-mode memories and the reduction in the number of 256×16 embedded memory blocks 106 utilized to implement the user-defined mixed-mode memories after process 500.

TABLE 1

| Write Size | Read Size | Number of direct-mapped memory blocks | Number of repacked memory blocks | Percent reduction |
|---|---|---|---|---|
| 1024 × 9 | 512 × 18 | 4 | 3 | 25% |
| 1024 × 9 | 256 × 36 | 4 | 3 | 25% |
| 1024 × 9 | 128 × 72 | 4 | 3 | 25% |
| 2048 × 18 | 1024 × 36 | 16 | 9 | 43.75% |
| 2048 × 30 | 512 × 120 | 16 | 15 | 6.25% |

TABLE 1-continued

| Write Size | Read Size | Number of direct-mapped memory blocks | Number of repacked memory blocks | Percent reduction |
|---|---|---|---|---|
| 2048 × 1 | 1024 × 2 | 16 | 1 | 93.75% |
| 4096 × 9 | 2048 × 18 | 16 | 9 | 43.75% |
| 4096 × 9 | 1024 × 36 | 16 | 9 | 43.75% |
| 4096 × 9 | 512 × 72 | 16 | 9 | 43.75% |
| 8192 × 18 | 4096 × 36 | 64 | 36 | 43.75% |
| 512 × 50 | 256 × 100 | 8 | 7 | 12.5% |

Although process 500 may be illustrated above with examples having specific data and address widths for the user-defined mixed-mode memory and embedded memory blocks 106, it should be appreciated that the principles discussed herein above may be applied to the user-defined mixed-mode memory and embedded memory blocks 106 having other data and address widths without departing from the scope and spirit of the disclosure. It should also be appreciated that the various operations of process 500 may be combined, divided, and/or reordered without departing from the scope and spirit of the disclosure. For example, operations 510 and 520 may be combined, and operations 530-570 may be reordered to perform process 500, following the principles discussed herein above.

In some embodiments, the various reassigning, remapping, adjusting, generating, or otherwise modifying of control and data signals in process 500 may be performed with respect to HDL code, RTL description, or other descriptions of the user design (e.g., to produce modified HDL code, modified RTL description, or other modified descriptions). In other embodiments, some operations (e.g., operation 510 to detect or infer instances of mixed-mode memory) of process 500 may be performed with respect to HDL code, RTL description, or other descriptions of the user design, while other operations may be performed with respect to a netlist corresponding to the user design. In some embodiments, all or part of process 500 may be performed within or in connection with design tools (e.g., parameterizable modules, libraries, templates and/or schematics) that aid users in creating designs for PLDs 100.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method comprising:
receiving a design identifying operations to be performed by a programmable logic device (PLD); and
synthesizing the design into a plurality of PLD components, wherein the synthesizing comprises:
detecting a mixed-mode memory operation in the design, the mixed-mode memory operation specifying memory access having different read and write data widths using a plurality of embedded memory blocks each having a fixed data width, each of the plurality of embedded memory blocks being associated with a corresponding write enable signal to be used for enabling each embedded memory block for writing,
determining a reduced number of embedded memory blocks to implement the mixed-mode memory operation, and
modifying the mixed-mode memory operation to remap the memory access to the reduced number of embedded memory blocks, the modifying comprising generating a write mask signal for each of the reduced number of embedded memory block, using the write enable signals, to allow a plurality of data portions to be written without overwriting each other in the reduced number of embedded memory blocks.

2. The computer-implemented method of claim 1, wherein:
the reduced number of embedded memory blocks is a minimum number of embedded memory blocks to implement the mixed-mode memory operation; and
the minimum number of embedded memory blocks is determined based on a size of the mixed-mode memory operation relative to the size of each embedded memory block.

3. The computer-implemented method of claim 1, wherein the detecting comprises checking whether the specified memory access writes data to only a portion of each embedded memory block and leaves an unused portion of each embedded memory block.

4. The computer-implemented method of claim 3, wherein the checking comprises comparing the read data width of the mixed-mode memory operation or the write data width of the mixed-mode memory operation with the fixed data width of each embedded memory block.

5. The computer-implemented method of claim 3, wherein:
each of the plurality of embedded memory blocks is associated with a corresponding write data signal to be used for passing data to be written in the each embedded memory block; and
the modifying comprises reassigning the write data signals to the reduced number of embedded memory blocks such that data to be written is spread among the reduced number of embedded memory blocks with at least one of the unused portions eliminated.

6. The computer-implemented method of claim 1, wherein the modifying comprises combining or reassigning the write enable signals to the reduced number of embedded memory blocks.

7. The computer-implemented method of claim 1, wherein:
the user design describes the mixed-mode memory operation as a user-defined write port and a user-defined read port that assign data and control signals to the plurality of embedded memory blocks to cascade the plurality of embedded memory blocks; and
the user-defined read and write ports define the read and write data widths.

8. The computer-implemented method of claim 1, further comprising:
generating configuration data to configure physical components of the PLD in accordance with the synthesized design; and
programming the PLD with the configuration data.

9. The computer-implemented method of claim 1, wherein the modifying comprises determining new positions within the reduced number of embedded memory blocks for the remapped memory access, the new positions including positions for a remapped memory block that are spread over two of the embedded memory blocks.

10. The computer-implemented method of claim 1, wherein:
each of the plurality of embedded memory blocks is associated with a corresponding read data signal to be used for passing data to be read from the each embedded memory block;
each of the plurality of embedded memory blocks is associated with a corresponding read enable signal to be used for enabling each embedded memory block for reading; and
the modifying comprises combining the read data signals and the read enable signals to read data with different read and write data widths.

11. A system comprising:
a processor; and
a memory adapted to store a plurality of computer readable instructions which when executed by the processor are adapted to cause the system to perform a computer-implemented method comprising:
receiving a design identifying operations to be performed by a programmable logic device (PLD), and
synthesizing the design into a plurality of PLD components, wherein the synthesizing comprises:
detecting a mixed-mode memory operation in the design, the mixed-mode memory operation specifying memory access having different read and write data widths using a plurality of embedded memory blocks each having a fixed data width, each of the plurality of embedded memory blocks being associated with a corresponding write enable signal to be used for enabling each embedded memory block for writing,
determining a reduced number of embedded memory blocks to implement the mixed-mode memory operation, and
modifying the mixed-mode memory operation to remap the memory access to the reduced number of embedded memory blocks, the modifying comprising generating write mask signal for each of the reduced number of embedded memory block, using the write enable signals, to allow a plurality of data portions to be written without overwriting each other in the reduced number of embedded memory blocks.

12. The system of claim 11, wherein:
the reduced number of embedded memory blocks is a minimum number of embedded memory blocks to implement the mixed-mode memory operation; and
the minimum number of embedded memory blocks is determined based on a size of the mixed-mode memory operation relative to the size of each embedded memory block.

13. The system of claim 11, wherein the detecting comprises checking whether the specified memory access writes data to only a portion of each embedded memory block and leaves an unused portion of each embedded memory block.

14. The system of claim 13, wherein the checking comprises comparing the read data width of the mixed-mode memory operation or the write data width of the mixed-mode memory operation with the fixed data width of each embedded memory block.

15. The system of claim 13, wherein:
each of the plurality of embedded memory blocks is associated with a corresponding write data signal to be used for passing data to be written in the each embedded memory block; and
the modifying comprises reassigning the write data signals to the reduced number of embedded memory blocks such that data to be written is spread among the reduced number of embedded memory blocks with at least one of the unused portions eliminated.

16. The system of claim 11, wherein the modifying comprises combining or reassigning the write enable signals to the reduced number of embedded memory blocks.

17. The system of claim 11, wherein the computer-implemented method further comprises:
generating configuration data to configure physical components of the PLD in accordance with the synthesized design; and
programming the PLD with the configuration data.

18. The system of claim 11, wherein the modifying comprises determining new positions within the reduced number of embedded memory blocks for the remapped memory access, the new positions including positions for a remapped memory block that are spread over two of the embedded memory blocks.

19. The system of claim 11, wherein:
each of the plurality of embedded memory blocks is associated with a corresponding read data signal to be used for passing data to be read from the each embedded memory block;
each of the plurality of embedded memory blocks is associated with a corresponding read enable signal to be used for enabling each embedded memory block for reading; and
the modifying comprises combining the read data signals and the read enable signals to read data with different read and write data widths.

20. A non-transitory machine-readable medium storing a plurality of machine-readable instructions which when executed by one or more processors of a computer system are adapted to cause the computer system to perform a computer-implemented method comprising:
receiving a design identifying operations to be performed by a programmable logic device (PLD); and
synthesizing the design into a plurality of PLD components, wherein the synthesizing comprises:
detecting a mixed-mode memory operation in the design, the mixed-mode memory operation specifying memory access having different read and write data widths using a plurality of embedded memory blocks each having a fixed data width, each of the plurality of embedded memory blocks being associated with a corresponding write enable signal to be used for enabling each embedded memory block for writing,
determining a reduced number of embedded memory blocks to implement the mixed-mode memory operation, and
modifying the mixed-mode memory operation to remap the memory access to the reduced number of embedded memory blocks, the modifying comprising generating a write mask signal for each of the reduced number of embedded memory block, using the write enable signals, to allow a plurality of data portions to be written without overwriting each other in the reduced number of embedded memory blocks.

* * * * *